United States Patent
Chen et al.

(10) Patent No.: US 11,965,947 B2
(45) Date of Patent: Apr. 23, 2024

(54) MULTIPLEX MRI IMAGE RECONSTRUCTION

(71) Applicant: Shanghai United Imaging Intelligence Co., LTD., Shanghai (CN)

(72) Inventors: Zhang Chen, Cambridge, MA (US);
Shanhui Sun, Cambridge, MA (US);
Xiao Chen, Cambridge, MA (US);
Terrence Chen, Cambridge, MA (US)

(73) Assignee: Shanghai United Imaging Intelligence Co., LTD., Xuhui District (CN)

( * ) Notice: Subject to any disclaimer, the term of this patent is extended or adjusted under 35 U.S.C. 154(b) by 68 days.

(21) Appl. No.: 17/533,276

(22) Filed: Nov. 23, 2021

(65) Prior Publication Data

US 2023/0160986 A1 May 25, 2023

(51) Int. Cl.
*G01R 33/56* (2006.01)
*G06N 3/045* (2023.01)
*G06N 3/08* (2023.01)

(52) U.S. Cl.
CPC ......... *G01R 33/5608* (2013.01); *G06N 3/045* (2023.01); *G06N 3/08* (2013.01)

(58) Field of Classification Search
CPC ....... G01R 33/5608; G06N 3/048; G06N 3/08
See application file for complete search history.

(56) References Cited

U.S. PATENT DOCUMENTS

2017/0176563 A1* 6/2017 Yablonskiy .......... G01R 33/246
2021/0011104 A1 1/2021 Ye
2022/0373631 A1* 11/2022 Correia ................ G01R 33/561

FOREIGN PATENT DOCUMENTS

CN 102488519 A * 6/2012

OTHER PUBLICATIONS

Liu, F, Feng, L, Kijowski, R. Mantis: Model-Augmented Neural network with Incoherent k-space Sampling for efficient MR parameter mapping. Magn Reson Med. 2019; 82: 174-188. https://doi.org/10.1002/mrm.27707 (Year: 2019).*
Machine Translation of CN-102488519-A obtained Apr. 27, 2023 (Year: 2012).*

* cited by examiner

*Primary Examiner* — Gregory H Curran
(74) *Attorney, Agent, or Firm* — Ziegler IP Law Group

(57) ABSTRACT

In Multiplex MRI image reconstruction, a hardware processor acquires sub-sampled Multiplex MRI data and reconstructs parametric images from the sub-sampled Multiplex MRI data. A machine learning model or deep learning model uses the subsampled Multiplex MRI data as the input and parametric maps calculated from the fully sampled data, or reconstructed fully sample data, as the ground truth. The model learns to reconstruct the parametric maps directly from the subsampled Multiplex MRI data.

13 Claims, 5 Drawing Sheets

MULTIPLEX MRI IMAGE RECONSTRUCTION

FIELD

The aspects of the disclosed embodiments relate generally to MRI image reconstruction, and more particularly to multiplex MRI image reconstruction.

BACKGROUND

The multi-flip-angle (FA) and multi-echo gradient recalled echo (GRE) method (referred to herein as "Multiplex MRI") provides the ability to simultaneously acquire multiple contrast images with a single scan. One Multiplex MRI scan offers multiple sets of images, including but not limited to: composited PDW/T1W/T2*W, aT1W, SWI, MRA, Blt map, T1 map, T2*/R2* maps, PD map, and QSM. One example of such a method is described in U.S. Patent Publication No. 2021/0011104 A1, entitled SYSTEMS AND METHODS FOR MAGNETIC RESONANCE IMAGING filed on Jul. 12, 2019 and published on Jan. 14, 2021, the disclosure of which is incorporated by reference herein in its entirety.

Current workflows to reconstruct the Multiplex MRI images generally include two steps. The first step is to reconstruct each echo image from k-spaces, where each echo image corresponds to one configuration of echo and FA settings. The reconstructed echo images have different contrasts and are aligned. In the second step, the parametric images or maps are processed based on the reconstructed echo images.

Multiplex MRI acquisition results in a relatively long scan time. To speed up the acquisition process, only the sub-sampled data can be acquired. However, reconstructing the echo images as well as the parametric maps from the subsampled Multiplex MRI data can be quite challenging.

Accordingly, it would be desirable to provide methods and apparatus that address at least some of the problems described above.

SUMMARY

The aspects of the disclosed embodiments are directed to an apparatus and method for Multiplex MRI image reconstruction. This and other advantages of the disclosed embodiments are provided substantially as shown in, and/or described in connection with, at least one of the figures, as set forth in the independent claims. Further advantageous modifications can be found in the dependent claims.

According to a first aspect, the disclosed embodiments provide an apparatus for Multiplex MRI image reconstruction. In one embodiment, the apparatus includes a hardware processor that is configured to acquire sub-sampled Multiplex MRI data and reconstruct parametric images from the sub-sampled Multiplex MRI data. The aspects of the disclosed embodiments enable the reconstruction of the parametric maps or images directly from the sub-sampled raw Multiplex MRI data.

In a possible implementation form, a machine learning model is trained to reconstruct the parametric maps directly from the sub-sampled data. The machine learning model is trained using sub-sampled Multiplex MRI data and parametric maps calculated from fully sampled data. During the training, the machine learning model takes the sub-sampled Multiplex MRI data as an input and generates a prediction as an output. The prediction is then compared to the parametric maps as the ground truth to train the model. According to the aspects of the disclosed embodiments, the machine learning model, which can be a deep learning model, learns to reconstruct the parametric maps directly from the sub-sampled Multiplex MRI data without reconstructing the echo images.

In a possible implementation form, during testing, the hardware processor is configured to reconstruct echo images from the sub-sampled Multiplex MRI data. Multiple echo images can be reconstructed together from the sub-sampled Multiplex MRI data so that the correlation between different echo images can be explored and utilized for better image reconstruction quality.

In a possible implementation form, during testing, the hardware processor is configured to generate the parametric maps from the echo images reconstructed from the sub-sampled Multiplex MRI data. Stacking multiple input images can be applied to both direct reconstruction and indirect reconstruction workflows.

In a possible implementation form, during testing, the hardware processor is configured to stack multiple echo images and input the stacked echo images into the machine learning model. Stacking the frames is to provide more information for echo image reconstruction. Because different echo images have different contrasts and provide different information about the underlying anatomy. By stacking the echo images, the model can then take more information as input.

In a possible implementation form, different sampling masks are used in acquisition of the Multiplex MRI image data. When the raw Multiplex MRI image data is acquired by subsampling, some of the original information is lost due to the subsampling. By using different sampling masks, the acquired information can be complementary. The designs of the different masks can be such that they subsample different regions. During reconstruction, the complementary information can be combined to recover the missing information.

In a possible implementation form, the sampling masks are configured to acquire information that is unique to a particular echo image. Information in different echo images can be redundant. For example, the overall anatomical structures may be the same or similar across different echo images. The sampling mask used in certain echo images can acquire different high frequency regions from the sampling mask used in other echo images. The high frequency information is helpful to recover the details in the image, which is important in the clinical application.

In a possible implementation form, the subsampled data is divided into two or more parts in a readout (RO) direction. Instead of reconstructing the full images at once, the images can be divided into several parts and each part can be reconstructed separately, which can then be combined into the final full images. This is useful in reducing memory consumption.

In a possible implementation form, a coil compression method is used. The coil compression is configured to reduce the number of coils. Using fewer compression coils to acquire the raw image data for reconstruction reduces the amount of data. This promotes speed and efficiency of the process.

In a possible implementation form, the machine learning model is a convolutional neural network (CNN) based deep learning model. The methods used for reconstruction can be compressed sensing (CS) based methods or deep learning based methods.

According to a second aspect, the disclosed embodiments provide a method for Multiplex MRI image reconstruction.

In one embodiment, the method includes acquiring sub-sampled Multiplex MRI data and reconstructing parametric images from the sub-sampled Multiplex MRI data. The aspects of the disclosed embodiments enable the reconstruction of the parametric maps or images directly from the sub-sampled raw Multiplex MRI data without reconstructing the echo images for Multiplex MRI.

According to a third aspect, the disclosed embodiments are directed to a system for Multiplex MRI image reconstruction. In one embodiment, the system includes a server that includes a processor configured to acquire sub-sampled Multiplex MRI data and reconstruct parametric images from the sub-sampled Multiplex MRI data. The aspects of the disclosed embodiments reconstruct the parametric images directly from the sub-sampled raw data without reconstructing the echo images for Multiplex MRI. The aspects of the disclosed embodiments enable the reconstruction of the parametric maps or images directly from the sub-sampled raw Multiplex MRI data without reconstructing the echo images for Multiplex MRI.

According to a fourth aspect the disclosed embodiments are directed to a computer program product embodied on a non-transitory computer-readable medium having machine readable instructions stored thereon, which, when executed by a computer cause the computer to execute the processes associated with aspects of one or more of the possible implementation forms described herein.

The aspects of the disclosed embodiments enable an accurate, computational power efficient, and memory efficient framework for under-sampled or sub-sampled Multiplex MRI data reconstruction. Good performance in image quality as well as reconstruction time is realized.

These and other aspects, implementation forms, and advantages of the exemplary embodiments will become apparent from the embodiments described herein considered in conjunction with the accompanying drawings. It is to be understood, however, that the description and drawings are designed solely for purposes of illustration and not as a definition of the limits of the disclosed invention, for which reference should be made to the appended claims. Additional aspects and advantages of the invention will be set forth in the description that follows, and in part will be obvious from the description, or may be learned by practice of the invention. Moreover, the aspects and advantages of the invention may be realized and obtained by means of the instrumentalities and combinations particularly pointed out in the appended claims.

BRIEF DESCRIPTION OF THE DRAWINGS

In the following detailed portion of the present disclosure, the invention will be explained in more detail with reference to the example embodiments shown in the drawings, in which.

In the accompanying drawings, an underlined number is employed to represent an item over which the underlined number is positioned or an item to which the underlined number is adjacent. A non-underlined number relates to an item identified by a line linking the non-underlined number to the item. When a number is non-underlined and accompanied by an associated arrow, the non-underlined number is used to identify a general item at which the arrow is pointing.

DETAILED DESCRIPTION OF THE DISCLOSED EMBODIMENTS

The following detailed description illustrates exemplary aspects of the disclosed embodiments and ways in which they can be implemented. Although some modes of carrying out the aspects of the disclosed embodiments have been disclosed, those skilled in the art would recognize that other embodiments for carrying out or practising the aspects of the disclosed embodiments are also possible.

Figure 1:
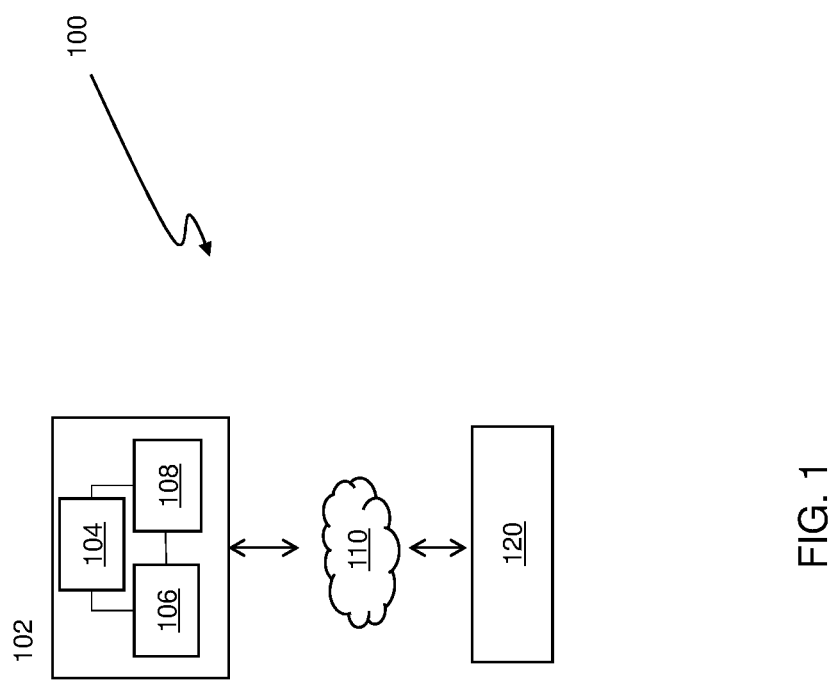
FIG. 1 is a block diagram of an exemplary system for multiplex MRI image reconstruction, in accordance with the aspects of the disclosed embodiments.

FIG. 1 is a block diagram of an exemplary system or apparatus 100 for Multiplex MRI image reconstruction in accordance with the aspects of the disclosed embodiments. The aspects of the disclosed embodiments are directed to reconstructing Multiplex MRI images. In one embodiment, a computing device 102 of the system 100 includes a processor 104 that is configured to acquire sub-sampled Multiplex MRI data and reconstruct parametric images directly from the sub-sampled Multiplex MRI data. This can occur without reconstructing the echo images.

Multi-flip-angle (FA) and multi-echo GRE (hereinafter "Multiplex MRI"), can simultaneously acquire multiple contrast images with just one single scan. With the single scan, Multiplex MRI can provide over 16 types of image contrasts and 9 types of parametric mappings. One Multiplex MRI scan often includes a combination of several echoes and different flip-angles and each combination leads to one echo image. With different echo and FA configure settings, a single scan can generate multiple (e.g., 7×2=14) echo data. Each echo image has different contrast information and the parametric maps, such as proton density weighted (PDW), T1 weighted (T1W), T2*, quantitative susceptibility mapping (QSM), can then be calculated based on the echo images.

With reference to FIG. 1, the system 100 includes an apparatus 102, such as a computing device or server. Although a server is described herein, and shown merely for illustration, the aspects of the disclosed embodiments are not so limited. In alternate embodiments, the apparatus 102 can comprise any suitable computing or processing apparatus, other than including a server.

In one embodiment, the apparatus 102 includes a processor 104, a neural network or machine learning model 106 and a memory 106. The processor 104, model 106 and memory 108 can be embodied in a single device or can comprise multiple devices communicatively coupled together.

There is further shown a communication network 110 and imaging system 120 or apparatus. The communication network 110 generally includes a medium through which the imaging system 120 and the apparatus 102 can communicate with each other. The imaging system 120, which can comprise any suitable MRI imaging stem, is configured to provide the Multiplex MRI data to the apparatus 102.

Although communication network 110 is shown communicatively coupling the imaging system 120 to the apparatus 102, the aspects of the disclosed embodiments are not so limited. In alternate embodiments the apparatus 102 can be connected or coupled to the imaging system 120 in any suitable manner. Additionally, the apparatus 102 can be configured to receive, acquire or generate Multiplex MRI data, as is generally described herein, from any suitable source in any suitable manner.

The aspects of the disclosed embodiments are directed to reconstructing parametric images or maps directly from the subsampled Multiplex MRI data without reconstructing the echo images for Multiplex MRI. In one embodiment, the workflow can be achieved by training the machine learning model 106, also referred to as a deep learning model, using subsampled Multiplex MRI data as the input. During the training phase, parametric maps are calculated from the fully sampled Multiplex MRI data, or reconstructed fully sampled Multiplex MRI data, as the ground truth. The model 106 learns to reconstruct the parametric maps directly from the subsampled Multiplex MRI data by comparing the prediction of the model 106 during the training phase to the ground truth and updating the model weights. Once the model 106 is fully trained, the model 106 can be implemented in testing. During the testing phase, fully sampled Multiplex MRI data is not available.

Figure 3:
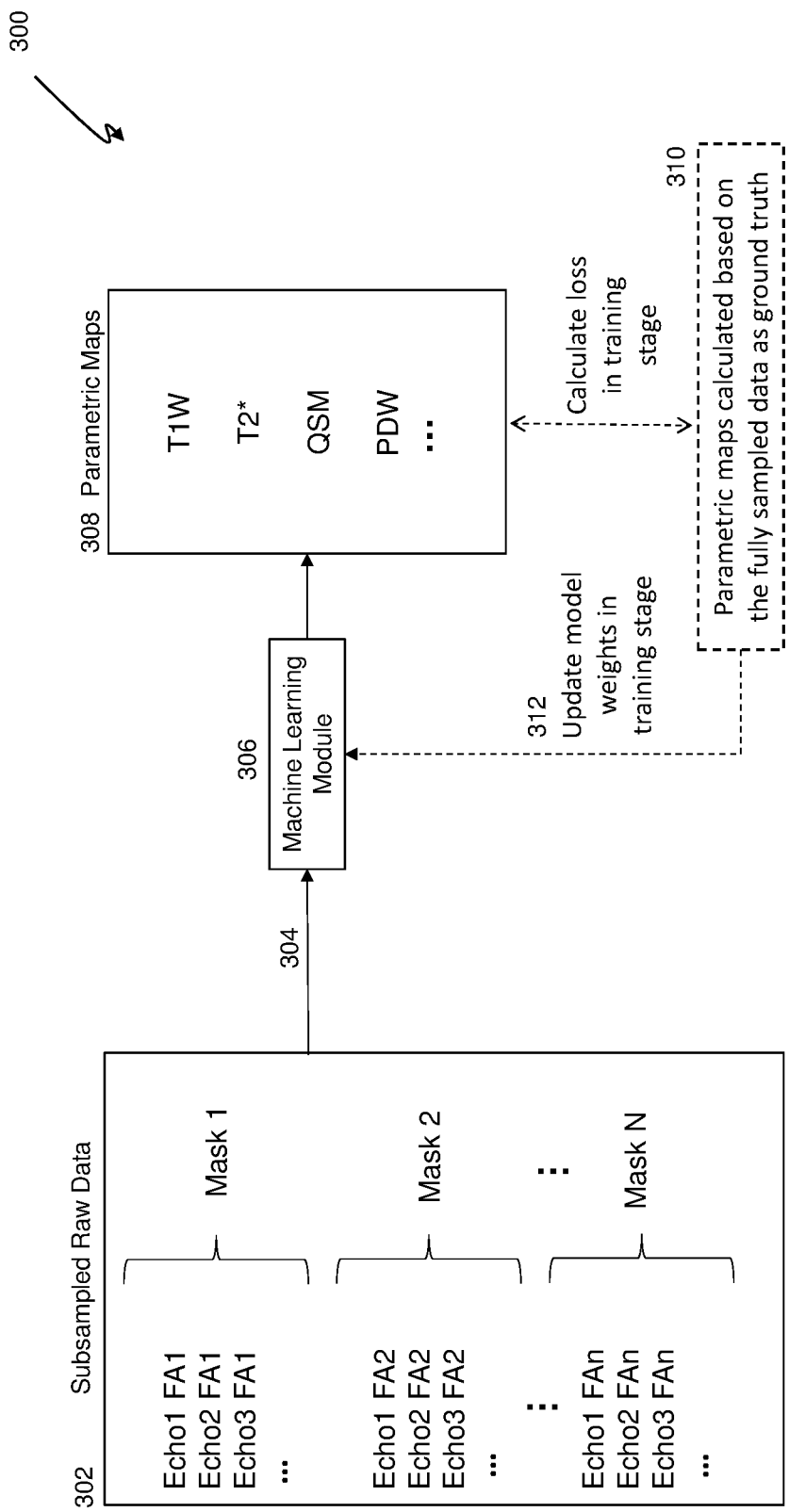
FIGS. 3 and 4 are illustrations of exemplary workflows incorporating aspects of the disclosed embodiments.

FIG. 3 illustrates one embodiment of a workflow 300 incorporating aspects of the disclosed embodiments. In this example, the parametric maps 308 are reconstructed directly from the sub-sampled Multiplex MRI data 302. The Multiplex MRI data is generally acquired through a gradient echo (GRE) based method for single-scan 3D multi-parametric MRI. The single scan can offer multiple sets of images, including but not limited to B1t and T1 maps, qualitative images of T1W, proton density weighted (PDW), T2* augmented T1W (aT1W), susceptibility weighted imaging (SWI), and optionally MR angiography (MRA), as well as parametric maps of T2* (R2*), PD, and quantitative susceptibility mapping (QSM). Reference is made to U.S. Patent Publication No. 2021/0011104 A1, Ser. No. 16/510, 285, the disclosure of which is incorporated herein by reference in its entirety.

As illustrated in the example of FIG. 3, the sub-sampled Multiplex MRI data 302 is acquired. In one embodiment, the sub-sampled Multiplex MRI data 402 indicates or is representative of the sub-sampled k-space. During an MRI scan, the Multiplex MRI data obtained is k-space data. To accelerate the MRI scan, often only subset of the k-space data is acquired by subsampling.

In the embodiment of FIG. 3, the sub-sampled Multiplex MRI data 302 includes a combination of different echo and flip angle (FA) configurations, where each combination leads to one echo image. The number of echo and flip angle combinations shown in FIG. 3 is merely exemplary. In alternate embodiments, there can be any suitable number of echo and flip angle combinations.

In one embodiment, the sampling masks used in each echo acquisition, shown in FIG. 3 as Mask 1 to Mask N, can be different. In some cases, information in different echo images can be different. For example, overall anatomical structures may be the same or similar across different echo images. One or more of the Mask 1 to Mask N can be designed to acquire more unique information to each echo image. For example, the mask used in certain echo images can acquire different high frequency regions from the mask used in other echo images. The high frequency information is helpful to recover the details in the image, which is important in the clinical application.

By using different sampling masks, the acquired information can be complementary. For example, for certain echo images, Mask 1 can be used. For other echo images, Mask 2 or Mask N can be used. The design of Mask 1 to Mask N is configured so that different regions of the data are sub-sampled. During reconstruction, complementary information is combined to recover the missing information.

In one embodiment, a machine learning model or module 306 receives as input 304, the sub-sampled Multiplex MRI data 302. The machine learning model 306 in this example is similar to the machine learning model 108 of FIG. 1. In this example, the machine learning model 306 is configured to reconstruct the parametric maps 308 from the sub-sampled Multiplex MRI data.

During training of the machine learning model 306, the machine learning model 306 receives the sub-sampled Multiplex MRI data 304 as the input 304 and outputs a prediction. The fully sampled Multiplex MRI data 310 is the ground truth. The prediction is compared to the ground truth and the model weights are updated 312 during the training phase.

During testing, the model 306 takes the sub-sampled Multiplex MRI data 304 as the input. The model 306 then generates or calculates the parametric maps 308.

In one embodiment, the input 304 can comprise the sub-sampled Multiplex MRI data with some pre-processing. This pre-processing can result in, for example, but is not limited to coil compressed data or read out (RO) cropped data.

For example, a coil compression method can be used to reduce the number of coils such that fewer compressed coils are used for reconstruction. As another example, instead of reconstructing the full images at once, the images can be divided into several parts by readout direction and each part can be reconstructed separately, which can then be combined into the final full images. These can be considered data pre-processing steps.

Figure 2:
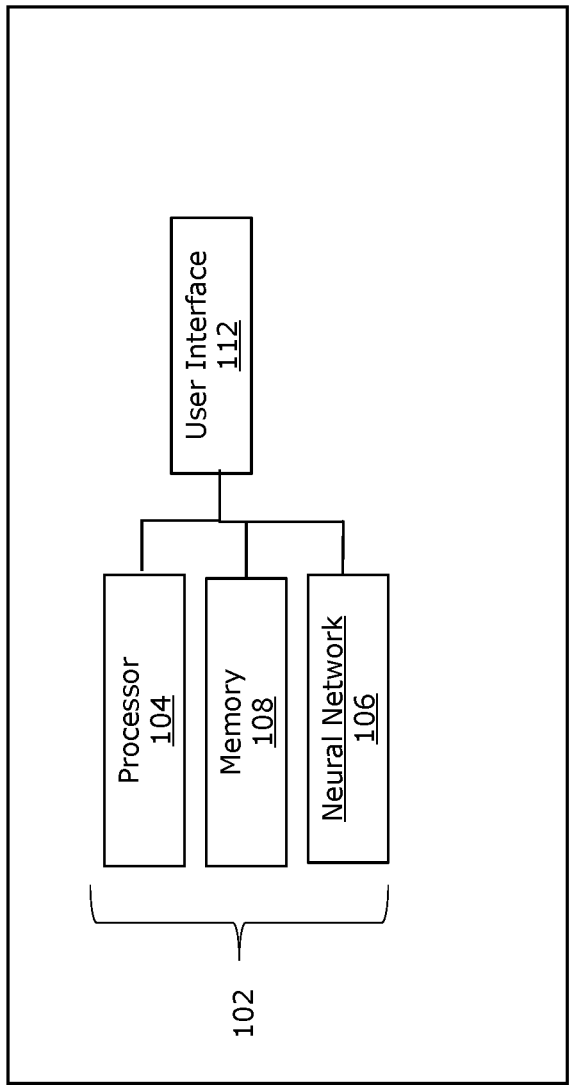
FIG. 2 is a block diagram of exemplary components of an apparatus incorporating aspects of the disclosed embodiments.

In one embodiment, the machine learning model 306, similarly to the neural network 106 of FIG. 2, comprises a deep learning network, such as a convolutional neural network (CNN). In alternate embodiment, the machine learning model 306 can include any suitable machine learning model, other than include a CNN.

Figure 4:
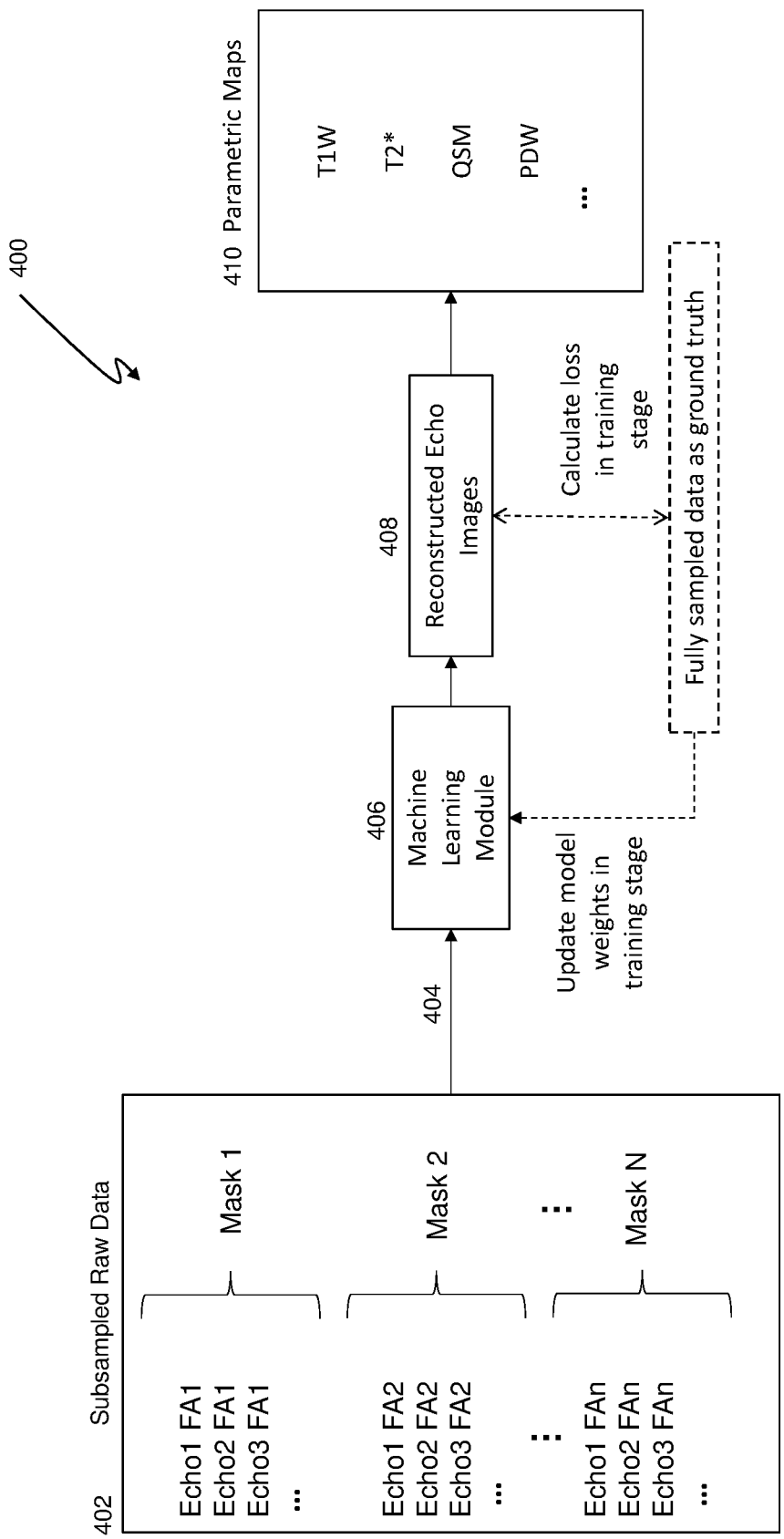

Referring to FIG. 4, in one embodiment, the echo images are first reconstructed. In this manner, multiple echo images can be reconstructed together such that the correlation between different echo images can be explored and utilized for better image reconstruction quality and speed.

As shown in the exemplary workflow 400 of FIG. 4, in this example, the machine learning model 406, similar to models 106 and 306 reconstructs the echo images 408 from the sub-sampled Multiplex MRI data 402. The parametric maps 410 are generated or calculated from the reconstructed echo images 410. The reconstructed echo images 408 are an intermediate result of the workflow 400.

In one embodiment, multiple echo images can be reconstructed together. This can be implemented, for example, by stacking the multiple echo images as an extra dimension in the input 404 and feeding the stack as the input 404 into the machine learning model 406. By stacking the echo images, the machine learning model 406 can take more information as input.

In the example workflows of FIGS. 3 and 4, the methods used for reconstruction can be CS based methods or deep learning based methods. For example, the models 306 and 406 can be a CNN based deep learning model.

Figure 5:
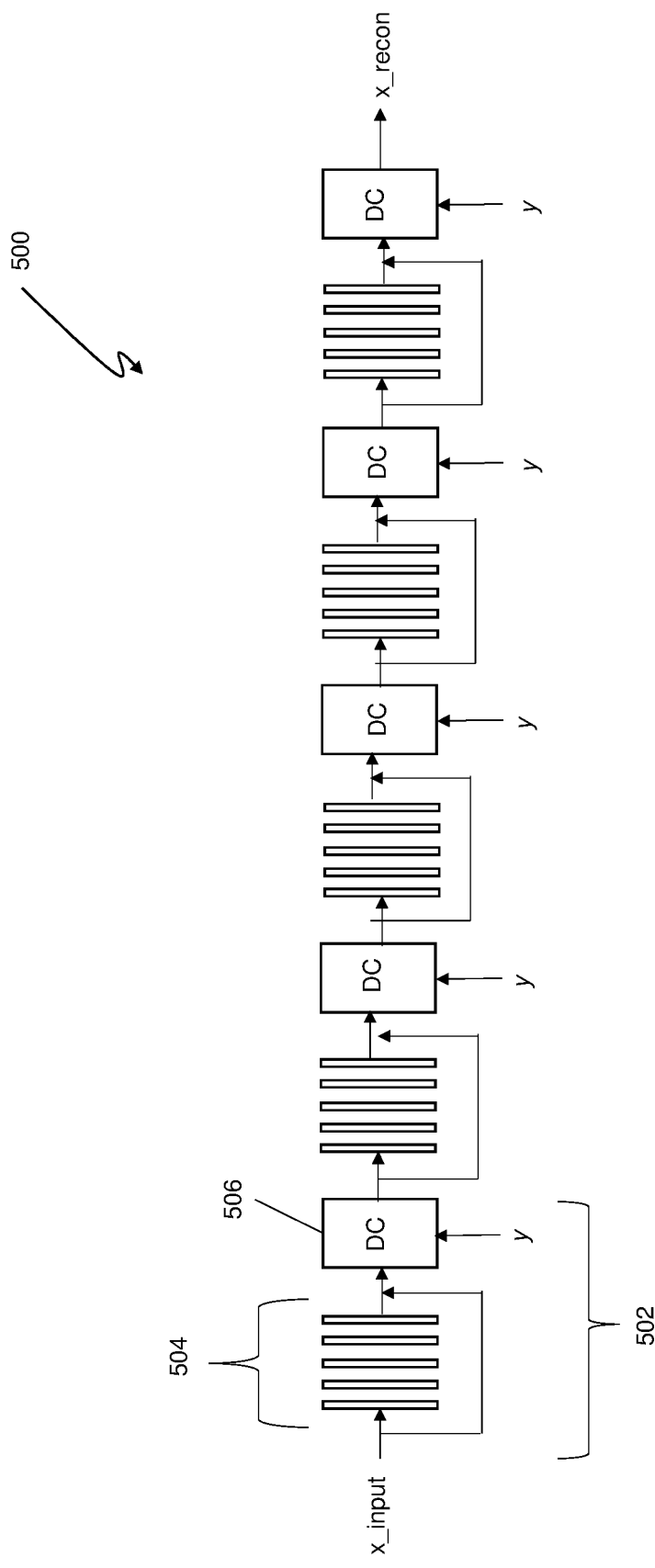
FIG. 5 is a block diagram of an exemplary architecture for a machine learning model incorporating aspects of the disclosed embodiments.

FIG. 5 illustrates one embodiment of an exemplary network architecture 500 for Multiplex data reconstruction. The architecture 500 can be implemented in the model 306 and 406 of FIGS. 3 and 4. In this example, the architecture 500, includes five convolutional blocks 502. Each block 502 will include five Convolutional layers 504 and one data consistency layer 506. The feature maps are forty-eight (48) for the first four (4) convolutional layers and two (2) for the last convolutional layer in each block. The x, y inputs indicate sub-sampled image inputs and k-space inputs, respectively. The real and imaginary numbers of complex values are transformed into two channels and fed into the network.

The architecture 500 is merely exemplary. In alternate embodiments, any suitable network architecture can be used to implement the models 306/406 described herein.

Referring again to FIG. 1, the apparatus 102 includes suitable logic, circuitry, interfaces and/or code that is configured to receive the sub-sampled Multiplex MRI data as is described herein. Examples of the apparatus 102 may include, but are not limited to, an application server, a web server, a database server, a file server, a cloud server, or a combination thereof.

In one embodiment, the processor 104 includes suitable logic, circuitry, interfaces and/or code that is configured to carry out the processes generally described herein. The processor 104 is configured to respond to and process instructions that drive the apparatus 102. Examples of the processor 104 includes, but is not limited to, a microprocessor, a microcontroller, a complex instruction set computing (CISC) microprocessor, a reduced instruction set (RISC) microprocessor, a very long instruction word (VLIW) microprocessor, or any other type of processing circuit. Optionally, the processor 104 may be one or more individual processors, processing devices and various elements associated with a processing device that may be shared by other processing devices. Additionally, the one or more individual processors, processing devices and elements are arranged in various architectures for responding to and processing the instructions that drive the apparatus 102. In one embodiment, the processor 104 is a hardware processor.

The memory 106 may comprise suitable logic, circuitry, interfaces, and/or code that may be configured to store instructions executable by the processor 104. The memory 202 is further configured to store the MRI data. The memory 106 may be further configured to store operating systems and associated applications of the apparatus 102 including the neural network 108. Examples of implementation of the memory 106 may include, but are not limited to, Random Access Memory (RAM), Read Only Memory (ROM), Hard Disk Drive (HDD), Flash memory, and/or a Secure Digital (SD) card. A computer readable storage medium for providing a non-transient memory may include, but is not limited to, an electronic storage device, a magnetic storage device, an optical storage device, an electromagnetic storage device, a semiconductor storage device, or any suitable combination of the foregoing.

The neural network 108 generally refers to an artificial neural network. In one embodiment, the neural network 108 is an unsupervised neural network that uses machine learning.

The communication network 110 may be a wired or wireless communication network. Examples of the communication network 110 may include, but are not limited to, a Wireless Fidelity (Wi-Fi) network, a Local Area Network (LAN), a wireless personal area network (WPAN), a Wireless Local Area Network (WLAN), a wireless wide area network (WWAN), a cloud network, a Long Term Evolution (LTE) network, a plain old telephone service (POTS), a Metropolitan Area Network (MAN), and/or the Internet.

In one embodiment, referring also to FIG. 2, a user interface 112, such as a display, can be used to present the results of the processing generally described herein. For example, in one embodiment, the parametric images can be presented on the user interface 112 for visualization and use.

Referring again to FIG. 1, in one aspect, the disclosed embodiments include a training phase and an operational or testing phase. In the training phase, the neural network 106, which can comprise or include one or more of the machine learning models 306 and 406 described herein, is trained, using sub-sampled Multiplex MRI data as the training data, to enable the neural network 106 to perform specific intended functions in the operational phase. The processor 104 is configured to execute an unsupervised or a semi-supervised training of the neural network 106 using the training data. In one embodiment, in the unsupervised training of the neural network 106, unlabeled training data is used for training of the neural network 106. In one embodiment, in the semi-supervised training of the neural network 106, a comparatively small amount of labeled training data and a large amount of unlabeled training data is used for training of the neural network 106.

Various embodiments and variants disclosed above, with respect to the aforementioned system 100, apply mutatis mutandis to the method. The method described herein is computationally efficient and does not cause processing burden on the processor 104.

Modifications to embodiments of the aspects of the disclosed embodiments described in the foregoing are possible without departing from the scope of the aspects of the disclosed embodiments as defined by the accompanying claims. Expressions such as "including", "comprising", "incorporating", "have", "is" used to describe and claim the aspects of the disclosed embodiments are intended to be construed in a non-exclusive manner, namely allowing for items, components or elements not explicitly described also to be present. Reference to the singular is also to be construed to relate to the plural.

Thus, while there have been shown, described and pointed out, fundamental novel features of the invention as applied to the exemplary embodiments thereof, it will be understood that various omissions, substitutions and changes in the form and details of devices and methods illustrated, and in their operation, may be made by those skilled in the art without departing from the spirit and scope of the presently disclosed invention. Further, it is expressly intended that all combinations of those elements, which perform substantially the same function in substantially the same way to achieve the same results, are within the scope of the invention. Moreover, it should be recognized that structures and/or elements shown and/or described in connection with any disclosed form or embodiment of the invention may be incorporated in any other disclosed or described or suggested form or embodiment as a general matter of design choice. It is the intention, therefore, to be limited only as indicated by the scope of the claims appended hereto.

What is claimed is:

1. An apparatus for Multiplex MRI image reconstruction, comprising:
   a hardware processor coupled to a memory, wherein the hardware processor is configured to:
   acquire sub-sampled Multiplex MRI data in a single scan; and
   reconstruct static parametric maps directly from the sub-sampled Multiplex MRI data by training a machine learning model using the sub-sampled Multiplex MRI data as an input, generating a prediction and comparing the prediction to static parametric maps calculated from fully sampled data.

2. The apparatus according to claim 1, wherein the hardware processor is configured to reconstruct echo images with the acquired sub-sampled MRI data prior to reconstructing the static parametric maps.

3. The apparatus according to claim 2, wherein the acquired sub-sampled Multiplex MRI data comprises echo images and the hardware processor is further configured to stack multiple ones of the echo images and input the stacked images into the machine learning model.

4. The apparatus according to claim 1, wherein the hardware processor is configured to acquire the sub-sampled Multiplex MRI data using different sampling masks.

5. The apparatus according to claim 1, wherein the hardware processor is configured to divide the acquired sub-sampled Multiplex MRI data into two or more parts in a readout (RO) direction.

6. The apparatus according to claim 1, wherein the model is configured to:
compare the prediction of the model based on only the public data to a ground truth; and
update weights of the model.

7. A computer implemented method for multiplex MRI reconstruction, the method comprising using a hardware processor to:
acquire sub-sampled Multiplex MRI data; and
reconstruct static parametric maps directly from the sub-sampled Multiplex MRI data by training a machine learning model using the sub-sampled Multiplex MRI data as an input, generating a prediction and comparing the prediction to static parametric maps calculated from fully sampled data.

8. The computer implemented method according to claim 7, the method further comprising training a machine learning model to reconstruct the static parametric maps directly from the acquired sub-sampled Multiplex MRI data using sub-sampled Multiplex MRI data as an input and static parametric maps reconstructed from fully sampled Multiplex MRI data as the ground truth.

9. The computer implemented method according to claim 8, wherein the method further comprises reconstructing echo images with the acquired sub-sampled MRI data prior to reconstructing the static parametric maps.

10. The computer implemented method according to claim 9, wherein the acquired sub-sampled Multiplex MRI data comprises echo images and the method further comprises stacking multiple ones of the echo images and inputting the stacked images into the machine learning model.

11. The computer implemented method according to claim 9, wherein the method further comprises applying different sampling masks to different echo images of the sub-sampled Multiplex MRI data.

12. The computer implemented method according to claim 8, wherein the method further comprises dividing the acquired sub-sampled Multiplex MRI data into two or more parts in a readout (RO) direction; reconstructing the two or more parts separately, and combining the reconstructed two or more parts into a final full image.

13. A computer program product comprising a non-transitory computer-readable medium having machine readable instruction stored thereon, which when executed by a computing apparatus, are configured to cause the computing apparatus to execute the method according to claim 7.

* * * * *